United States Patent [19]
Murphy et al.

[11] Patent Number: 5,769,644
[45] Date of Patent: Jun. 23, 1998

[54] SHELF FOR HOUSING PRINTED CIRCUIT BOARDS

[75] Inventors: Richard G. Murphy, Nepean; Bruce I. Dolan, Kanata, both of Canada

[73] Assignee: Northern Telecom Limited, Montreal, Canada

[21] Appl. No.: 722,431

[22] Filed: Sep. 6, 1996

[51] Int. Cl.[6] ..................................................... H01R 9/09
[52] U.S. Cl. ............................ 439/61; 361/788; 361/796
[58] Field of Search ............................ 439/61; 361/785, 361/788, 796, 797, 803

[56] References Cited

U.S. PATENT DOCUMENTS

| 4,271,455 | 6/1981 | McComas | 361/600 |
| 4,498,717 | 2/1985 | Reimer | 439/61 |
| 4,744,006 | 5/1988 | Duffield | 439/61 |
| 5,546,282 | 8/1996 | Hill et al. | 439/61 |

OTHER PUBLICATIONS

IBM Technical Disclosure Bulletin "Card Term Block Assly" vol. 20, No. 1, Jun. 1977. by G.B. Barrdo.

Primary Examiner—Gary F. Paumen
Assistant Examiner—T. C. Patel
Attorney, Agent, or Firm—R. J. Austin

[57] ABSTRACT

A shelf for housing printed circuit boards in which a back plane has an extension in the form of a back plane extender printed circuit board electrically connected to the back plane and extending forwards from the back plane at one side of the shelf. In a location forwardly of the back plane, the extender printed circuit board carries a connector structure which extends outwards from the extender printed circuit board and has connectors outwards from the extender printed circuit board. These connectors are accessible either from the front or rear of the shelf dependent upon connector orientation. This structure avoids the need for connectors on the rear face of the back plane thus allowing for the back plane to be located further to the rear and permitting increase in size in circuit boards to be mounted within the shelf. The connector structure is preferably detachable so as to permit its replacement with a different design of connector structure. The connector structure may include its own printed circuit board which when changed for a board of different design may change the operation of the total circuit board arrangement including the back plane.

6 Claims, 4 Drawing Sheets

SHELF FOR HOUSING PRINTED CIRCUIT BOARDS

This invention relates to shelves for housing printed circuit boards.

Conventionally, shelves for housing printed circuit boards provide either for the insertion of the boards separately in a front to rear direction in the shelves or for insertion of circuit packs into the shelves, the circuit packs themselves comprising at least one printed circuit board and possibly including a protective cover for the boards. The protective cover may provide a heat sink for the circuit pack construction and include external fins for heat removal purposes. In any event, such a shelf normally comprises a printed circuit board structure extending across a rear of the shelf and this structure is normally referred to as a "back plane".

It is also known to provide connectors extending into the rear of such a back plane for input and output signals into the printed circuit boards and the printed circuit boards to be inserted into the shelf are normally connected into the front of the back plane. It is also known to provide for connection of cables to the fronts of circuit packs or printed circuit boards. This is for the convenience of customers' usage dependent upon whether the customer needs to have his input and output signals provided at the rear or the front of the shelf. Problems do arise in a situation where connector access is provided at the front of the shelf to printed circuit boards contained therein in that it may be required for other connectors to extend into the rear of the back plane, because a customer needs to have access to both front and rear of the back plane for such purposes. In an attempt to overcome this problem, shelf constructions have been suggested in which cables are caused to extend from the rear of the back plane and around the side or over the top of the shelf structure, and these cables are connected to connectors towards the front of the shelf for frontal access purposes. A problem which exists with this type of arrangement and which also applies to conventional rear connection to back planes, is that connectors at the rear of a back plane require space behind the back plane. Such an arrangement necessarily causes the back plane to be placed more forwardly than would otherwise be the case, thereby reducing the surface area of printed circuit boards to be inserted into the shelf. In addition, the provision of cables extending from the rear of the back plane towards forward connections has been found to be an expensive procedure. In order to overcome the problem of the use of cables in this way and to enable the back plane to be placed as rearwardly as possible, printed circuit boards referred to herein as "back plane extender printed circuit boards" have been suggested and which are connected to the fronts of back planes while extending forwardly at the sides of shelves for connection at their forward ends to connectors. However, such forward placed connectors on back plane extender boards are necessarily oriented so as to face sideways whereby the advantage of the customer being able to obtain access to the front of a shelf for all purposes is obviated. In other words, while a customer may plug directly with his connections into the fronts of printed circuit boards mounted into the shelf, a lateral connection is required for plugging into the connectors at the front of the back plane extender boards.

The present invention provides a shelf for housing printed circuit boards in which the above problems are minimized.

Accordingly, the present invention provides a shelf for housing printed circuit boards, the shelf having an open front, a plurality of side-by-side receiving stations for printed circuit boards to be received through the open front, a back plane extending across a rear of the shelf, at least one back plane extender printed circuit board electrically connected to the back plane and extending forwardly from the back plane at one side of the shelf, and a connector structure having first terminals, the extender printed circuit board having a specific mounting position for mounting the connector structure to the extender printed circuit board with the first terminals connected into circuitry of the extender printed circuit board, and the connector structure having second terminals which, with the connector structure mounted in the specific mounting position, are positioned outwardly from the extender printed circuit board.

In a preferred arrangement of the invention, the second terminals face forwardly of the shelf for frontal access to the second terminals.

As may be seen from the preferred arrangement of the above-defined invention, the shelf construction enables frontal access to connection into an extender printed circuit board while omitting usage of cables which are themselves connected into the rear of the back plane. The back plane may therefore be positioned at its rearmost position thereby providing for as large as possible surface area for printed circuit boards to be housed within the shelf and the elimination of the interconnecting cables from the back plane which have been found to enable a more usable shelf construction to be provided. Alternatively, the second terminals face rearwardly of the shelf for their rear access when the connector structure is in the mounting position.

In a further preferred arrangement, the connector structure is provided with its own printed circuit board, i.e. a connector structure printed circuit board which is a further board from the extender printed circuit board, and this further board has at least one connector extending from it. With the connector structure mounted at the specific mounting position, the first connector has the first terminals connected into the extender printed circuit board. At least a second connector extends from the connector structure printed circuit board and has either forwardly or rearwardly facing second terminals. With this preferred arrangement, the connector structure printed circuit board provides a convenient extension for the extender printed circuit board thereby potentially increasing the design capabilities of the extender printed circuit board. In particular the connector structure printed circuit board may have electronic components upon it in addition to the first and second connectors of the connector structure.

It is also to be preferred for the connector structure to be completely detachable as a unit. Apart from providing the advantages specified in the last preceding paragraph, this allows for interchangeability of connector structures having different circuitry patterns and possibly provided with different electronic components for the purpose of modifying the circuitry of the extender printed circuit board.

In another preferred construction, the specific mounting position referred to above is a first specific mounting position and the extender printed circuit board has a second specific mounting position located rearwardly of the first specific mounting position for the purpose of mounting a connector structure with terminals facing rearwardly for rear access for connection into the extender printed circuit board.

In this latter preferred arrangement, the shelf is readily available for use both for frontal and for rear access at customer's choice. So far as rear access is concerned, in this case, apart from the further printed circuit board of the connector structure providing the preferred extension to the extender printed circuit board, the back plane is located as rearwardly as possible as the connections into its rear face are avoided for rear connection purposes.

Embodiments of the invention will now be described, by way of example, with reference to the accompanying drawings, in which.

Figure 1:
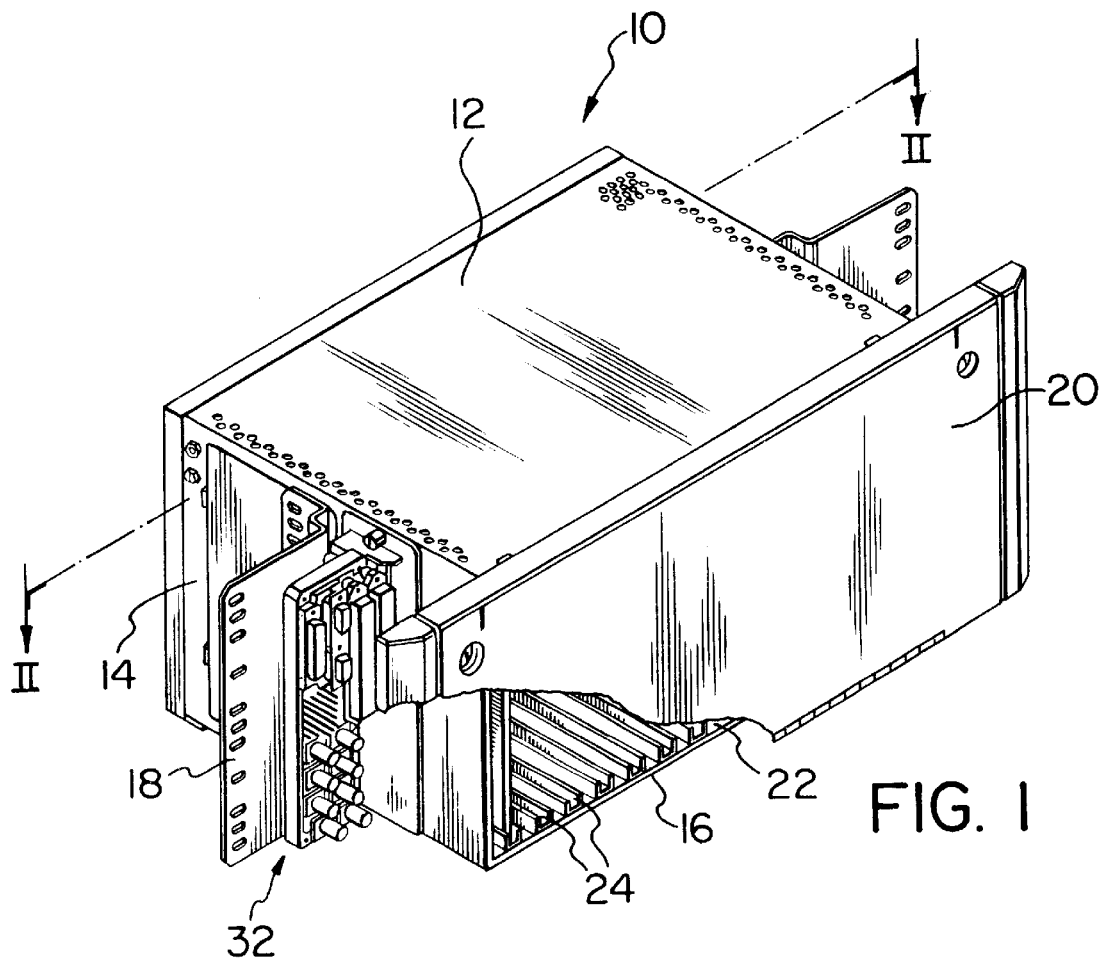
FIG. 1 is an isometric view, partly removed, of a shelf for mounting printed circuit boards.
Figure 2:
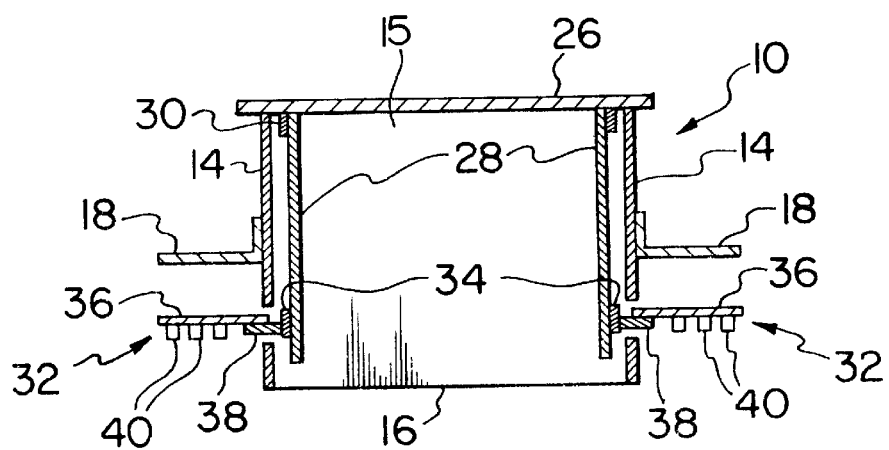
FIG. 2 is a diametric cross-sectional view through the shelf of FIG. 1 taken along line II—II in FIG. 1.

As shown in FIG. 1, in a first embodiment, a shelf 10 for housing printed circuit boards comprises a box housing construction including a top 12 and sides 14, at opposite ends of the shelf space 15, sides 14 (see also FIG. 2) and a base 16. Extending outwardly from the two sides 14 are L-shaped mounting brackets 18 for mounting the shelf within a frame. At the front of the housing is provided a removable front cover 20 for covering a frontal opening 22 of the shelf as shown in FIG. 1, through which the printed circuit boards to be contained within the shelf may be inserted into receiving stations dictated by conventional guides 24.

Figure 3:
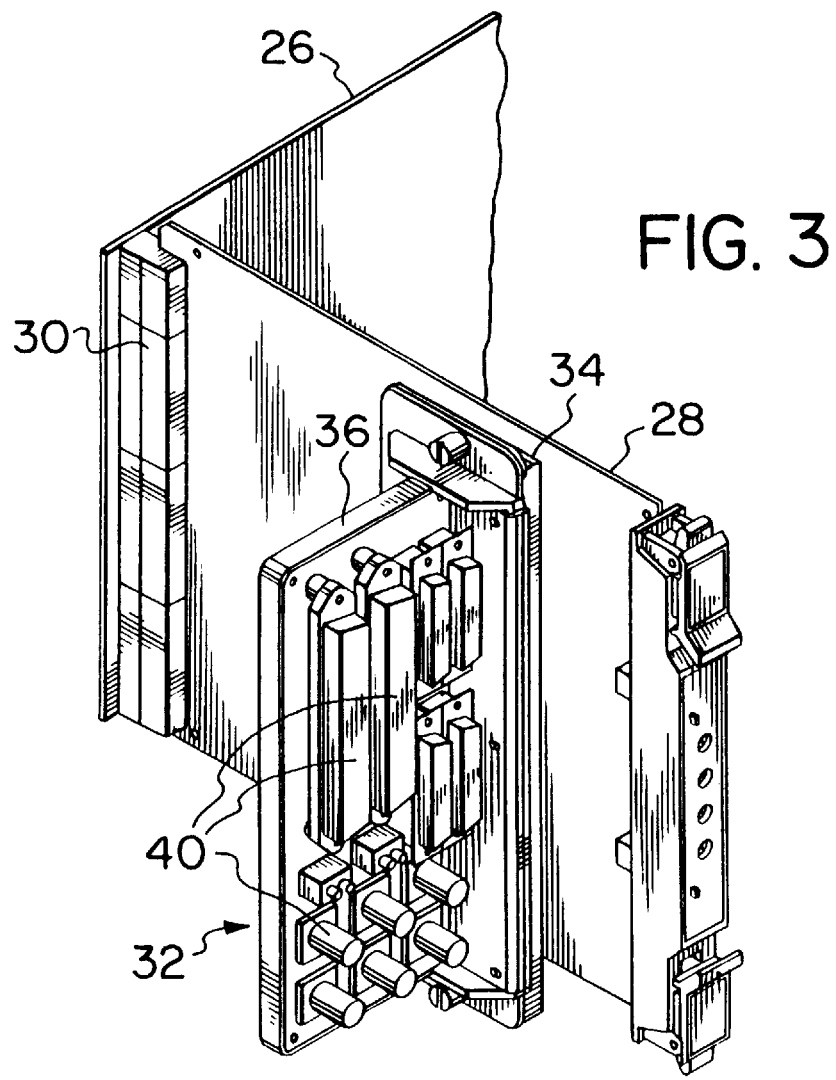
FIG. 3 is an isometric view of an extender printed circuit board and connector structure assembly of the first embodiment and to a larger scale than shown in FIG. 1.

The shelf 10 is provided in conventional manner with a back plane 26 (FIGS. 2 and 3) which extends across the rear of the shelf. In addition to this, the shelf has at each of its sides immediately within each of the side walls 14, an extender printed circuit board 28 which is connected by a connector 30 into the back plane and extends forwardly almost to the frontal opening 22 of the shelf. Each of the printed circuit boards 28 is provided with a mounting position for a connector structure 32, this mounting position being dictated by the front to rear position of at least one vertical connector 34 mounted upon an outwardly facing side of the board 28. The connector structure 32 comprises a connector structure printed circuit board 36 and at least one connector 38 (FIG. 2) which is connected into the connector 34 of the board 28. In addition to this, the structure 32 comprises a plurality of forwardly facing connectors 40 which are interconnected with the connector 38 through the circuitry of the board 36. The structure 32 is detachably mounted upon the printed circuit board 28.

As may be realized from the first embodiment, the connector structure 32 allows for frontal access for a customer into the extender printed circuit board 28 which is convenient where frontal access is also required for connection into the fronts of printed circuit boards to be housed within the receiving stations of the shelf. In addition, this frontal access to the connectors of the connector structure 32 is useful where access to the rear of the shelf is difficult or impossible. Frontal access to the connectors 40 thus ensures that the difficulty and space requirements for sideways insertion into the printed circuit boards 28 is avoided. Further advantages stem from the fact that the back plane 26 is disposed as far rearwardly in the shelf as is physically possible thereby ensuring maximum usage area of the printed circuit boards to be housed within the shelf.

There are further distinct and important advantages such as the fact that the printed circuit board 36 of each of the structures 32 provides an extension of the extender printed circuit board 28 itself thereby potentially allowing for an increase in the design capabilities of the extender printed circuit board. These design capabilities may extend to the inclusion of electronic components mounted upon the board 36 and forming part of the circuitry. Another important advantage stemming from this is that with the structure 32 being detachable, replacement structures 32 may be used having different circuitry designs having the capability of changing the total circuitry structure of each printed circuit board 28.

Figure 4:
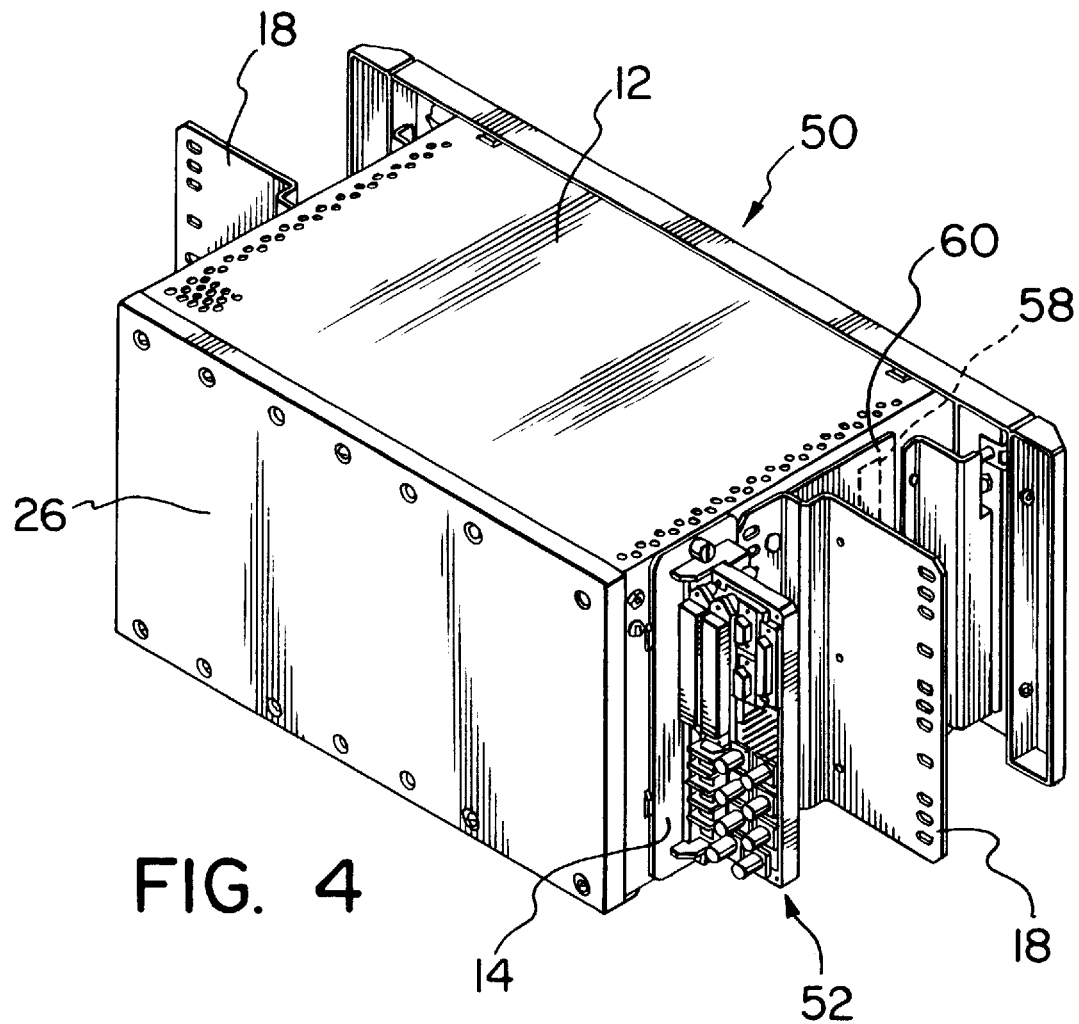
FIG. 4 is a rear isometric view of a shelf according to a second embodiment.
Figure 5:
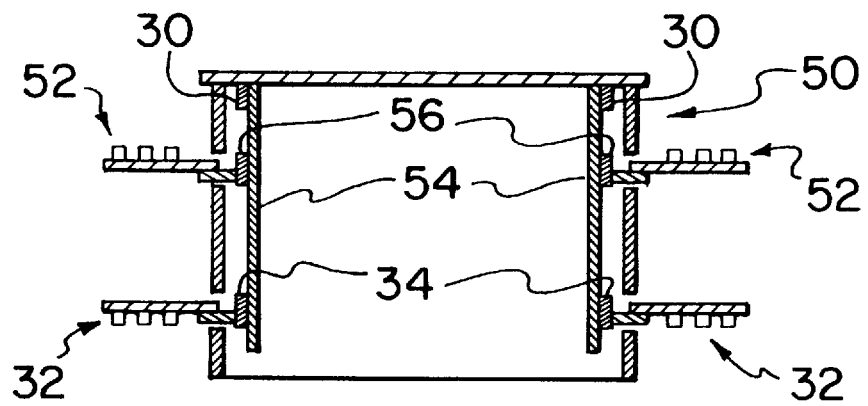
FIGS. 5 and 6 are, respectively, views similar to FIGS. 2 and 3 of the second embodiment.
Figure 6:
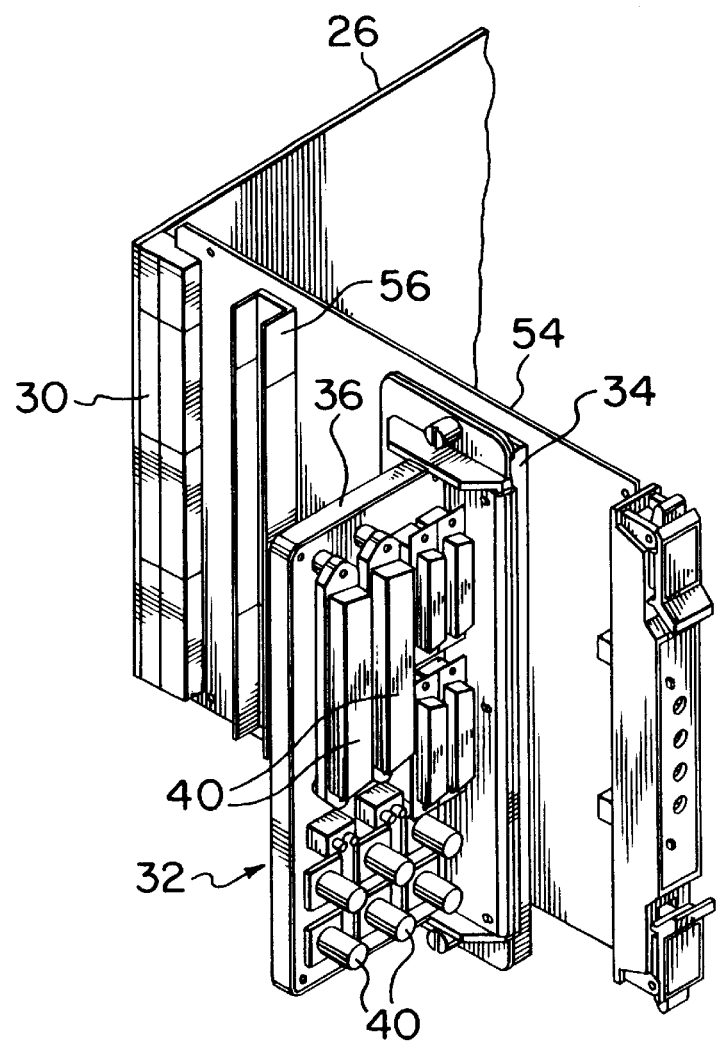

The invention is not limited to the use of forwardly facing connector structures as described in the first embodiment. This is exemplified by the second embodiment now to be described. In the second embodiment as shown in FIG. 4, a shelf 50 is basically of the structure described in the first embodiment and similar parts carry the same reference numerals. However, in the second embodiment as shown by FIG. 4, the structure is provided at each side with a connector structure 52 which is mounted into an associated extender printed circuit board 54 (FIG. 5) at another mounting position provided by a vertical connector 56 (FIG. 6) disposed rearwardly of the connector 34. In this case, each or both of the structures 52 may be used in conjunction with a connector structure 32 as described in the first embodiment so that there are provided rearwardly and forwardly facing connectors 40 for the shelf for connection purposes into the shelf by a customer. Alternatively, as shown by FIG. 4, only one or both of the connector structures 52 is employed with the connectors 32 being omitted and the resultant openings 58 in side walls of the shelf being covered by a cover plate 60 of the mounting brackets 18. In this particular arrangement, in which total rear access may be provided for connection into the extender printed circuit boards, the employment of printed circuit boards in the connector structure 52 does increase the design capability of the extender printed circuit boards as described in the first embodiment. Also in the case as in the second embodiment where rear connectors are avoided on the back of the back plane, then the back plane is again positioned as far rearwardly as is possible thereby maximizing the possible design surface area of printed circuit boards to be mounted within the shelf construction.

Figure 7:
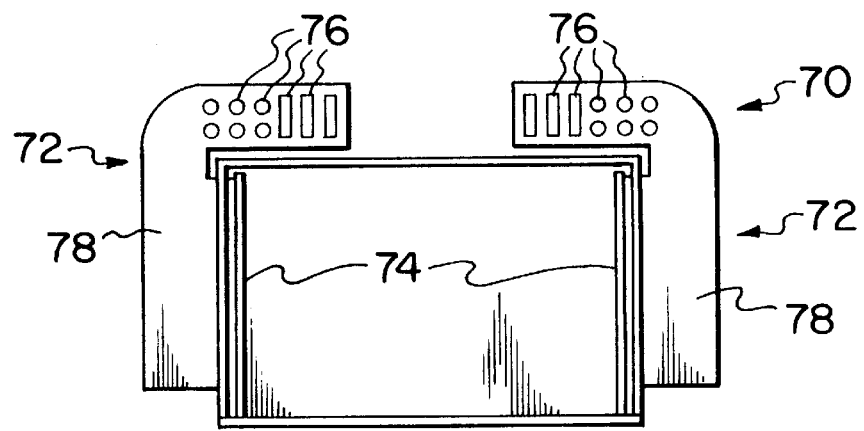
FIG. 7 is a front view of a shelf according to a third embodiment.

In a third embodiment shown diagrammatically in FIG. 7 which is a front view of a shelf 70, two connector structures 72 extending outwardly of the shelf from associated extender printed circuit boards 74, extend over the top of the shelf to provide forward facing (or rearward facing in a modification) connectors 76 over the shelf. The circuit boards 78 of the structures 72 are thus larger which may be an advantage for design purposes. They may also be narrower so as to minimize the total shelf width where this is important.

What is claimed is:

1. A shelf for housing printed circuit boards, the shelf having an open front, a pair of sides extending from a rear to the front of the shelf, the sides being spaced apart at opposite ends of a shelf space, a back plane extending across a rear of the shelf, a plurality of side-by-side receiving stations for printed circuit boards to be received through the open front for connection to the back plane, the receiving stations located in the shelf space, at least one back plane extender printed circuit board electrically connected to the back plane and extending forwardly adjacent one side of the shelf, and a connector structure comprising a connector structure printed circuit board which is electrically connected to the extender printed circuit board, the connector structure printed circuit board extending sideways from the back plane extender printed circuit board and sideways away from the housing and having a connector spaced away from the housing, the connector having terminals each of which extends in a front to rear direction of the shelf for outside access.

2. A shelf according to claim 1 wherein the connector structure printed circuit board carries a plurality of electronic components.

3. A shelf according to claim 1 wherein the back plane extender printed circuit board is disposed within the shelf space and the connector structure printed circuit board extends from the back plane extender printed circuit board through an opening in the adjacent side of the shelf and laterally outwards from the housing.

4. A shelf according to claim 1 wherein the terminals for the connector face forwardly for frontal access.

5. A shelf according to claim 1 wherein the terminals for the connector face rearwardly for rear access.

6. A shelf according to claim 1 wherein the connector structure printed circuit board extends sideways away from the housing and then around and over the housing and the connector is located above the housing.

\* \* \* \* \*